United States Patent
Brodsky et al.

(10) Patent No.: US 6,695,623 B2
(45) Date of Patent: Feb. 24, 2004

(54) ENHANCED ELECTRICAL/MECHANICAL CONNECTION FOR ELECTRONIC DEVICES

(75) Inventors: William Louis Brodsky, Binghamton, NY (US); David V. Caletka, Apalachin, NY (US); Michael Anthony Gaynes, Vestal, NY (US); Voya Rista Markovich, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/871,554

(22) Filed: May 31, 2001

(65) Prior Publication Data

US 2002/0182900 A1 Dec. 5, 2002

(51) Int. Cl.[7] ............................................. H01R 12/00
(52) U.S. Cl. .......................... 439/66; 439/67; 439/561; 29/843; 29/842
(58) Field of Search ........................... 439/66, 91, 83, 439/70, 59–65; 29/842, 843, 882, 874, 834, 854; 174/250, 8

(56) References Cited

U.S. PATENT DOCUMENTS

| | | | |
|---|---|---|---|
| 4,574,331 A | 3/1986 | Smolley | 361/393 |
| 4,581,679 A | 4/1986 | Smolley | 361/395 |
| 5,007,841 A | 4/1991 | Smolley | 439/66 |
| 5,222,014 A | 6/1993 | Lin | 361/414 |
| 5,315,481 A | 5/1994 | Smolley | 361/707 |
| 5,324,205 A | 6/1994 | Ahmad et al. | 439/66 |
| 5,362,421 A * | 11/1994 | Kropp et al. | 252/512 |
| 5,380,212 A * | 1/1995 | Smeenge et al. | 439/86 |
| 5,598,033 A | 1/1997 | Behlen et al. | 257/686 |
| 5,704,794 A | 1/1998 | Lindeman | 439/66 |
| 5,810,607 A | 9/1998 | Shih et al. | 439/66 |
| 5,967,804 A | 10/1999 | Yoshizawa et al. | 439/91 |
| 5,990,563 A | 11/1999 | Kim | 257/778 |
| 6,007,349 A | 12/1999 | Distefano et al. | 439/71 |
| 6,008,071 A * | 12/1999 | Karasawa | 438/115 |
| 6,032,356 A * | 3/2000 | Eldridge et al. | 28/843 |
| 6,033,233 A * | 3/2000 | Haseyama et al. | 439/66 |
| 6,050,832 A * | 4/2000 | Lee et al. | 439/91 |
| 6,062,879 A * | 5/2000 | Beaman et al. | 439/66 |
| 6,132,222 A * | 10/2000 | Wang et al. | 439/70 |
| 6,174,174 B1 * | 1/2001 | Suzuki et al. | 439/71 |
| 6,247,635 B1 * | 6/2001 | Olsson | 228/118 |
| 6,541,867 B1 * | 4/2003 | Fjelstad | 257/773 |

OTHER PUBLICATIONS

IBM Technical Disclosure Bulletin, vol. 37, entitled "Flexible Power Connection for Array Applications", May, 1994, 2 pp.

* cited by examiner

*Primary Examiner*—Alexander Gilman
(74) *Attorney, Agent, or Firm*—Patrick J. Daugherty

(57) ABSTRACT

A method and structure for electrically and mechanically interconnecting an array of printed circuit board contacts to an array of module contacts with a plurality of deformable resilient electrical conductors with two ends. Each of the conductor ends are electrically connected to one of the contact arrays. A portion of the conductor may deform longitudinally and laterally responsive to movement of the printed circuit board relative to the module responsive to heating and cooling cycles and mechanical vibrations, while maintaining the electrical connection of the contact arrays. An interposer with apertures extending through the interposer carries the conductors in the apertures and is used to align the conductors with the contacts. A method for excluding a rigid adhesive means from a portion of the resilient conductor is also taught.

10 Claims, 2 Drawing Sheets

ENHANCED ELECTRICAL/MECHANICAL CONNECTION FOR ELECTRONIC DEVICES

FIELD OF THE INVENTION

The present invention relates to the mounting of electronic modules upon printed circuit boards and, more particularly, to a structure and method for mechanically and electrically connecting the module to the printed circuit board through a plurality of compliant electrical conductors attached to contact surfaces, said connection having an improved fatigue life.

BACKGROUND OF INVENTION

In many computer and other electronic circuit structures, an electronic module such as a Central Processor Unit (CPU), memory module or ASIC, must be connected to a printed circuit board (hereinafter sometimes "PCB"). In connecting a module to a PCB, a plurality of individual electrical contacts on the base of the module must be connected to a plurality of corresponding individual electrical contacts on the PCB. This set of contacts on the PCB dedicated to receiving the module contacts is known as a land grid array (hereinafter sometimes "LGA") site.

The required interconnect density on today's printed circuit boards and associated module(s) are such that distances between contacts within an LGA site as small as 0.8 millimeter must be supported. In order to connect a module structurally and electrically to an LGA site on a PCB in a reliable fashion, a number of problems must be overcome. First, the initial alignment of the respective contacts on the module and the PCB with designated conductive connections must be achieved. Second, a reliable, electrically conductive connector with a satisfactory fatigue life and stable contact resistance for connecting module and PCB contacts must be provided. And, lastly, where the conductive connector is permanently attached to one or both of the module and PCB contacts with solder or some other permanent adhesive compound, the adhesive or solder may "wick" through the connector array and spread in an undesirable fashion, perhaps even creating electrical "shorts" between adjacent connectors or contacts. What is also needed is a way to prevent the permanent adhesive or solder from "wicking" through the connector and spreading beyond the desired attachment interface.

With respect to the first problem, each contact within a land grid array site on a circuit board must be aligned with an individual electrically conductive connector for electrically connecting the contact to a corresponding contact on a module. Each individual connector must also be aligned with its designated module contact. It is also important that the individual connectors are electrically isolated from each other, in order to prevent undesired cross-connections, such as a "short-circuit" connection between adjacent PCB and module contacts.

With respect to the second problem, the connectors must provide a reliable connection between PCB and module contacts that has an acceptable performance relating to stable contact resistance and fatigue life. Accordingly, the connector must resist forces that effectively work to separate the connectors from the PCB and module contacts. Such forces are inherently generated by the use of a module/PCB assembly.

For example, module substrates are typically fabricated from ceramic materials. The coefficient of thermal expansion (hereinafter sometimes "CTE") of ceramic modules typically ranges from 2 to 10 parts-per-million (ppm). This is much lower than that of a PCB fabricated from an epoxy resin/glass cloth substrate, which will typically have a CTE in the range of about 15 through about 20 ppm. Therefore, an assembly of a ceramic substrate module and an epoxy resin substrate PCB will be an assembly of "thermally mismatched" components with respect to their CTE's. During the operation of this assembly in a typical computing application, the assembly will be subject to heating and cooling cycles inherent in the electrical and mechanical use of the assembly. Since the CTE's of the module and the PCB do not correspond, they will expand and contract at different rates as the assembly is subjected to heating and cooling cycles. Since they will expand and contract at different rates, the ceramic module and epoxy resin PCB will necessarily move with respect to each other during heating and cooling cycles, resulting in shear forces acting upon module and PCB contact connections. The connectors located at the corners of the module have the highest amount of shear strain, because they are the farthest from the neutral point at the center of the module; they have the largest distance to neutral point (DNP) value and, therefore, must withstand the largest displacement force during the heating and cooling cycles of the structure. The average strain imposed upon an individual contact connection is quantified by dividing the relative in-plane displacement between the module contact and the PCB contact by the height of the contact connection, also defined as the deformable length of the contact.

Vibration forces also act upon the electrical contacts. Any connection between module and PCB contacts must reliably withstand vibration forces inherent in the operation of the assembly such as, for example, the mechanical vibrations generated by cooling fans and other mechanical equipment. The connection must also withstand mechanical vibration forces, which arise from physical handling of the assembly during manufacturing, and from handling and movement of the device that the assembly may be installed into.

A typical prior art means of connecting the module contacts to the PCB contacts is to use solder hierarchy. For example, a high-melt solder is applied as a ball or columnar shape to each of the contacts in a chip to module substrate contact array and reflowed. A low-melt solder paste is applied to each of the contacts within a corresponding PCB contact array to module substrate. The two contact arrays are aligned and brought into contact with each other to form an assembly. The assembly is heated in order to reflow the low-melt paste, and the assembly is then allowed to cool and thereby solidify the low-melt solder interface into a semi-rigid permanent connection between the PCB and module contacts within the aligned arrays without disturbing the high-melt solder joints.

Since the average shear strain imposed upon an individual corner contact connection is determined by dividing the differential Distance to Neutral Point (DNP) displacement by the deformable length of the contact, a typical solder ball contact connection, which is about 0.03 inches in height, is less preferred than a solder column contact connection, which is typically about 0.05 to about 0.08 inches high. Solder columns, accordingly, afford an increased thermo-mechanical fatigue life in comparison to solder ball connections, typically by a factor of about 2 to about 3. However, solder column technologies are more difficult to form due to cast in place or clasp and attach processes. Furthermore, since solder connections deform inelastically and in response to thermal mismatch shear displacements, multiple heating and cooling cycles can eventually cause solder connections to fail.

Moreover, as the array density of the connectors increases, the application of solder to the contacts is problematic in preventing the solder from spreading outside of the contact areas and causing undesirable shorts between adjacent contacts.

Therefore, what is needed is a method and structure for aligning the PCB and module contacts. What is also needed is a method and structure that provide a reliable electrical connection between the module and PCB contacts that withstands forces from vibration and accommodates shear displacements from mismatches in coefficients of thermal expansion between the module components and the PCB substrate components. And, lastly, it is also preferred that the method and structure prevent the undesirable spread of solder or other conductive adhesives beyond the desired contact/connector interface.

SUMMARY OF THE INVENTION

A method and structure for electrically and mechanically interconnecting an array of printed circuit board contacts to an array of module contacts with a plurality of deformable resilient electrical conductors. A portion of the conductors is rigidly affixed to at least one of the contact arrays. Another portion of the conductor may deform longitudinally and laterally responsive to movement of the printed circuit board relative to the module, while maintaining the electrical connection of the contact arrays. An interposer with apertures extending through the interposer carries the conductors in the apertures and is used to align the conductors with the contacts. A method for excluding a rigid adhesive means from a portion of the resilient conductor is also taught.

DETAILED DESCRIPTION OF THE INVENTION

Figure 1:
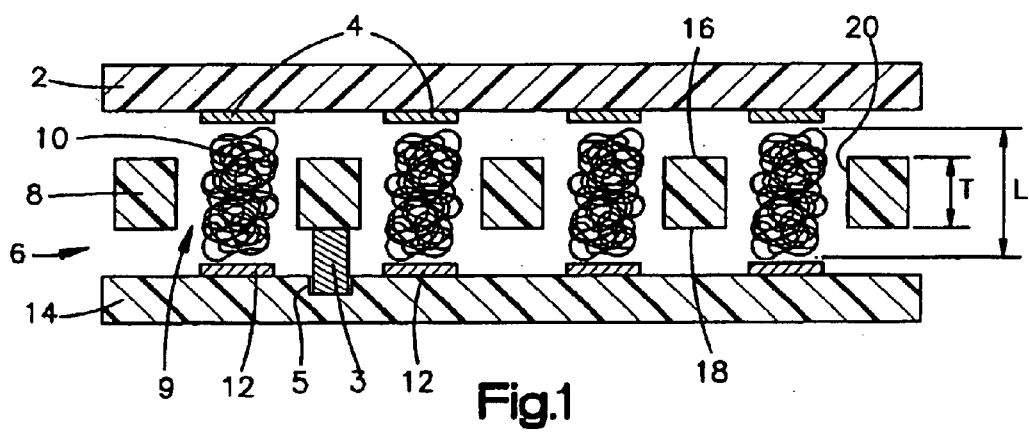
FIG. 1 is a side sectional view of a land grid array (LGA) site according to the present invention, comprising an array of contacts on an electronic module substrate, an array of contacts on a printed circuit board (PCB), and an interposer with electrical conductors disposed between the module and PCB.

Referring now to FIG. 1, a structure and method according to the present invention is provided. Specifically, a side sectional view of an electronic module substrate 2 and a printed circuit board (PCB) 14 is illustrated, showing a land grid array (LGA) site comprising an may of PCB contacts 12 and a corresponding array of module contacts 4. The PCB contacts 12 may be continuous with underlying circuitry (not shown) or be part of a through hole structure (not shown). Located between the module contacts 4 and the PCB contacts 12 is an alignment interposer 8, said interposer 8 having a plurality of apertures 9. Disposed within each aperture 9 is a deformable conductor 10. The apertures 9 are spaced from each other in an array corresponding to the array defined by the module contacts 4 and PCB contacts 124 so that each of the apertures 9 is aligned with one of the module contacts 4 and one of the PCB contacts 12.

The alignment of the interposers with the module 2 and PCB 14 is achieved by inserting mechanical alignment pins 3 located on the interposer S into receiving holes 5 located on the PCB 14. Interposer to module alignment is achieved by alignment features, typically cantilever beams, that contact the module substrate edge. Examples of common edge alignment techniques are four-edge cantilever beams or two-edge rigid stops with two-edge cantilever beams. One method that may be used with the present invention is a method and structure described in U.S. patent application Ser. No. 09/800,148, filed Mar. 6, 2001, by William Brodaky, titled "METHOD AND STRUCTURE FOR CONTROLLED SHOCK AND VIBRATION OF ELECTRICAL iNTERCONNECTS," the disclosure of which is hereby incorporated.

Figure 4:
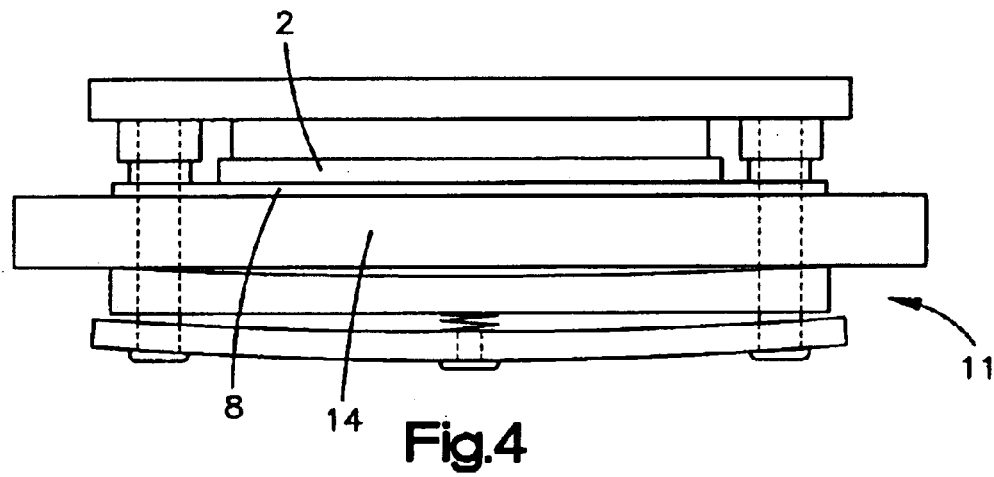
FIG. 4 is a side perspective view of an assembly of the module and PCB of FIG. 1 according to the present invention.

Once the module 2, interposer 8 and PCB 14 are aligned as described above, they may be clamped together with a clamping mechanism 11 to form an assembly as shown in FIG. 4, and thereby actuate an electrical connection of each of the module contacts 4 with a corresponding PCB contact 12 via the conductor 10 disposed between them. As shown in FIG. 1, the contacts 4 and 12 may have a width less than the width of the corresponding apertures 9 and, accordingly, the contacts 4 are brought into compressive contact wit the conductors 10, but not the interposer 8. Alternatively, the widths of contacts 4 and 12 may be greater than the apertures 9 widths, resulting in compressive contact of the contacts 4 and 12 with the interposer upper surface 16 and lower surface 18, respectively. Such a method and structure are described in detail in U.S. patent application Ser. No. 09/804,529 by Bhatt et at titled "PRINTED CIRCUIT BOARD TO MODULE MOUNTING AND INTERCONNECTING STRUCTURE AND METHOD," filed Mar. 12, 2001, the disclosure of which is hereby incorporated.

The conductor 10 shown in FIG. 1 is a wadded wire "fuzz button" connector similar to those produced by Cinch Inc. The conductor 10 has an inherent resilience that allows the conductor to expand upward and downward, and unrestrained the conductor 10 will expand to a length L larger than that of thickness T of the interposer 8. Accordingly, when a module contact 4 is brought downward into contact with the interposer top surface 16 across an aperture 9, and an opposing PCB contact 12 is brought upward into contact with the interposer bottom surface 18 across the same aperture 9, a conductor 10 disposed within the aperture 9 will be compressed into contact with the contacts 12 and 4, resulting in an electrical connection between the contacts 12 and 4. Since the resilient conductor 10 is being forcibly compressed by the contacts 12 and 4, it exerts forces normal to the contacts 12 and 4.

For the compressive assembly of the components shown in FIG. 1, it is preferable that a precious metal wire having a random orientation be used forte conductor 10 to provide multiple contact points on the contacts 4 and 12, increasing the reliability of the overall electrical interconnection by providing multiple hertzian or high localized stress contacts. Another advantage of a "multiple contacts" conductor 10 is that it is better able to penetrate contamination films (not shown) which may be present upon module and PCB electrical contacts 12 and 4, when compared to a prior art "flat-on-flat" contact system (not shown). Alternative embodiments of the conductor 10 may be a plated elastomeric member a precious metal plated wire or a stamped metal contact with precious metal plating. Other embodiments may be apparent to one skilled in the art.

Figure 2:
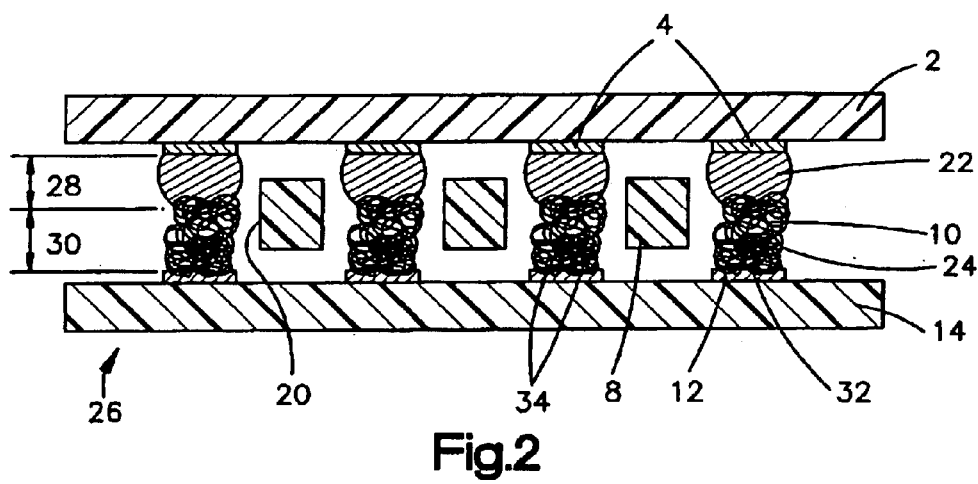
FIG. 2 is another side sectional view of the assembly of FIG. 1, further comprising connective elements.
Figure 5:
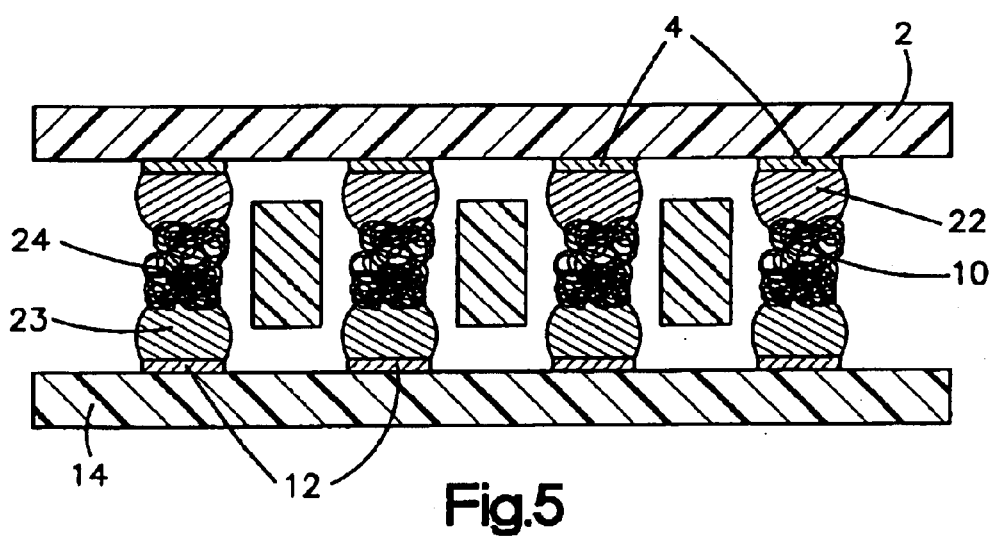
FIG. 5 is a side sectional view of another assembly according to the present invention.

Alternatively, the conductors 10 may be permanently attached to the module contacts 4, the PCB contacts 12, or both, through a permanent attachment process. Referring now to FIG. 2, the conductors 10 are shown attached to the module contacts 4 by means of a solder connection 22. To form the assembly 26 of FIG. 2, it is preferable to apply the solder 22 to the module pads 4, align the interposer 8 with the module 2 and thereby align the conductors 10 with the module contacts 4, bring the conductors 10 into contact wit the solder 22, reflow the solder 22 to incorporate upper portions of the individual strands 24 of the conductor 10, and then allow the solder to again cool and set into a permanent connection between the contacts 4 and the conductors 10. The PCB 14 is then aligned with the interposer 8, thereby aligning the conductors 10 with the PCB contacts 12, and the PCB contacts 12 are brought into electrical contact with the conductors 10. A clamping mechanism 11 maintains the compressive connection of the conductor 10 and PCB contacts 12. Alternatively, as shown in FIG. 5 solder 23 can be disposed on the PCB contacts 12 and the solder reflowed to incorporate lower portions of the individual strands 24 of the conductor 10, thereby creating a permanent connection between the PCB contacts 12 and the conductors 10, as described above.

The reflowed solder connections 22 incorporate a portion of the strands 24, the portions incorporated defining engagement regions 28 along the top of the conductors 10. In order to restrain the flowing of solder 22 within the engagement regions 28, the flowing solder 22 must be prevented from "wickiug" along the wire strands 24 and thereby flowing beyond the desired engagement region 28. This may be accomplished by selectively plating the wire strands 24 beyond the desired engagement region 28, thereby defining an exclusion region 30 along the conductors 10, wherein the solder will not adhere to or flow along those plated portions of the strands 24. In this way, the reflowing solder connections 22 will remain within the desired engagement regions 28 until they have cooled and solidified into the permanent solder connections 22 shown in FIG. 2. Various polymeric solder mask materials could also be used to prevent 'wicking' of the solder. The entire conductor could be coated with a liquid solder mask which is then cured. Photo imaging and etching techniques would then be used to remove the solder mask from the end portions (28) of the conductors. Although solder 22 is utilized to make the permanent attachment of the conductors 10 to the module contacts 4 in the embodiment shown in FIG. 2, alternate means for permanent attachment may be utilized.

In one example of an embodiment of the present invention, Example 1 (not shown), an electrically conductive adhesive, specifically Ablebond 8175 made by Ablestick Laboratories, is applied to the PCB contacts 12. The adhesive is applied by a stencil deposit method, using a 0.005" thick stencil with an array of 0.020" diameter apertures corresponding to the PCB contact 12 array. The adhesive deposits are 0.020" in diameter, are hemispherically shaped and are between 0.003–0.004" tall. After aligning mechanical alignment pins 3 located on the interposer S with receiving holes 5 formed on the PCB 14, the conductors 10 are brought into contact with the electrically conductive adhesive deposit After adhesive cure, four point probe measurements of the interconnection between PCB 14 backside and interposer 8 backside showed a low contact resistance in the range of about 5 to about 40 milliohms. (There is some variable probe contact resistance in these measurements that may be as high as about 20 to about 30 milliohms). The PCB contacts 12 were gold plated and had through holes. The adhesive would partially wet down into the through holes but not so much so as to starve the hemispherical deposit and prevent adhesive interconnection between PCB contacts 12 and conductors 10. The conductor wadded wire strands 24 were gold plated. Noble metal plated surfaces are preferred for low and stable contact resistance interconnections. Additional suitable metallurgical surfaces are palladium, silver and palladium nickel alloys. Nickel, tin, copper and aluminum surfaces provide much higher contact resistance that has significant resistance drift during stress and are, therefore, less suitable for demanding microelectronics interconnection. One advantage of using an electrically conductive adhesive over solder is low temperature joining, wherein temperatures may be less than or equal to about 150° C. Another advantage is that there is no requirement that the conductors 10 have a non-wettable surface to prevent solder wicking.

A re-workable structure is possible by using thermoplastic electrically conductive adhesives, such as Staystik 181 manufactured by Alpha Metals Inc. The wet thermoplastic adhesive, with the solvent not yet driven off, is used to wet the conductor 10. A bond cycle then drives off the solvent, developing the electrical conducting network and adhesively bonding the conductors 10 to the PCB contacts 12. If the interposer 8 and conductor 10 need to be removed from the PCB 14, heat and mechanical force could be used to disengage the conductor 10 from the PCB contacts 12.

Referring again to FIG. 2, the exclusion regions 30 along the conductors 10 may freely deform or flex without the rigidity imparted by the solder 22, in contrast to those strand 24 portions embedded in the rigid solder connections 22. Accordingly, the conductor 10 may elastically deform laterally and vertically in response to movement of the module contact 4 relative to the PCB contact 12. This is important where the module substrate 4 and PCB 10 have divergent coefficients of thermal expansion (CTE). For example, where ceramic modules typically have CTE's ranging from 2 to 10 parts-per-million (ppm), PCB fabricated from epoxy resin/fiber cloth substrates typically have CTE's ranging from about 15 to 20 ppm, where the fiber cloth may be composed of glass, kevlar or other fibers. Accordingly, when an assembly of a ceramic module substrate 4 and an epoxy resin/fiber cloth substrate PCB 10 experiences heating and cooling cycles inherent in the operation of such an assembly, the divergent CTE's result in divergent rates of thermal expansion and contraction, and therefore divergent lateral rates of expansion and contraction with respect to the resilient conductor 10.

If the contacts 4 and 12 are connected by a prior art solder column connection (not shown), the thermal mismatch thus described results in inelastic strains within the solder column and its attachment points to the module and PCB contacts every time a prior art module/solder connection/PCB assembly heats up and cools down. In contrast, the resilient conductor 10 exclusion region 30, according to the present invention, may elastically deform laterally responsive to movement of the module substrate 4 relative to the PCB 10, and thereby reduce strain damage imposed on the solder connection 22 and the compressive connection 32. Additionally, thermal cycling, electrical operation and mechanical vibrations result in longitudinal forces acting upon the conductors 10 as the module 2 and PCB 14 tend to move vertically with respect to each other. Accordingly, forces resulting from repeated heating and cooling cycles and mechanical vibrations can be absorbed and dissipated through the elastic deformation of the conductor 10, postponing or preventing the solder connections 22 and compressive connections 32 from developing fatigue failures, in contrast to a prior art solder connection.

Also, due to multi point contact between the resilient conductor 10 and PCB contact 12, slippage of individual contact points does not create an electrical discontinuity. It is also important that expansion forces exerted normally upon the solder connections 22 and PCB contacts 12 by the conductors 10 compressed there between are great enough to keep the multiple contact surfaces 34 of the conductor 10 firmly engaged in constant contact with the contacts 12 sufficient that the conductor surfaces 34 does not slide along the contacts 12 as said contacts 4 and 12 move relative to each other laterally. In this way, constant electrical connection between the conductor 10 and contacts 12 is ensured. If the conductor contact surfaces 34 are instead allowed to slide along the surfaces of the contacts 12, then intermittent electrical failure may be experienced by the module contact 4/conductor 10/PCB contact 12 assembly when a single point contact interface occurs.

The interposer 8 may impart structural integrity to the module/conductor/PCB assembly 26. In the embodiment of the invention shown in FIG. 2, the sidewalls 20 of the apertures 9 are straight-sided. Alternative sidewall embodiments may be contoured (not shown). The shape of sidewall 20 may be specified to provide a desired structural function. For example, a contoured sidewall 20 can improve reliability of the assembly by providing additional room for contact conductors to deform laterally.

By providing for a compressive connection between the conductors 10 and the PCB contacts 12, the assembly 26 can be readily disassembled by field technicians and reassembled without the need for breaking and reforming conductive adhesive connections. This provides an advantage over prior art fixed connections in terms of time and ease of serviceability of the assembly 26.

However, it may be desired to fixedly attach a conductor to both module and PCB contacts. In an alternative embodiment of the present invention (not shown), solder may be permitted to entirely wet the conductor 10, and thereby form a continuous solder hierarchy connection between the contacts 4 and 12. In this way, a solder column with integral conductor 10 is formed. As with the prior art solder column (not shown), this type of contact 4-to-contact 12 connection is rigid. However, the strands 24 of the conductors 10 will serve to reinforce the solder connection (not shown) formed thereby, and may result in a solder column-type connection of superior life and fatigue and stress resistance compared to a prior art solder column.

Figure 3:
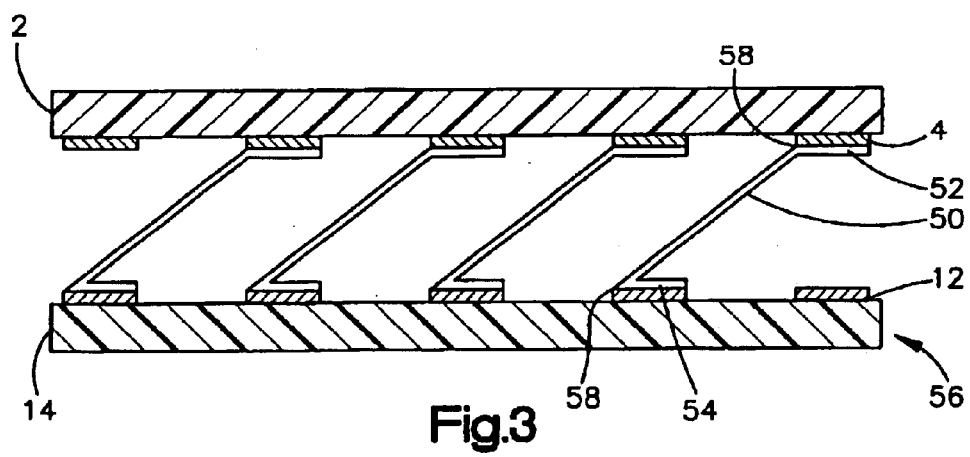
FIG. 3 is a side sectional view of another assembly according to the present invention.

Referring now to FIG. 3, another deformable conductor 50 is provided. The conductors 50 are pre-stamped and formed single-wire leaf spring structures, affixed to the contacts 4 and 12 with an electrically conductive adhesive 58 to form a composite structure 56. The structure 56 is formed by disposing each of the conductors 50 within an aperture 9 of the interposer 8 (not shown) and aligning the interposer 8 with the module contacts 4 wherein each of the conductor top interfaces 52 is aligned with one module contact 4, as described above and illustrated in FIGS. 1 and 2. The conductor top interfaces 52 are affixed to the module contacts 4 with the conductive adhesive 58, as described above, and the interposer 8 is removed. After removal of the interposer 8, the conductor bottom interfaces 54 are aligned with the PCB contacts 12 via an alignment means and affixed to the PCB contacts 12 with the conductive adhesive 58. The conductor bottom interfaces 54 may be aligned with the PCB contacts 12 via a split prism vision system, as is well known in the art. Alternatively, the interposer 8 may be left in place to impart alignment and structural features to the resultant assembly.

The interposer insulator 8 used to align the conductors 10 and 50 may be used only as a manufacturing fixture, being removed after the first conductor end is attached. As utilized for the structure 56 of FIG. 3, it may be a disposable member, used as a process carrier for the conductors 50 and then removed and discarded (or kept for reuse) prior to the final assembly of structure 56. Or it may remain with the conductors 10 in the final assembly 26 of FIG. 2, and thereby enable a compressive connection between one or both of the module contacts 4 and PCB contacts 12 and the conductor 10, and further impart structural form and integrity to the assembly 26.

The resilient leaf-spring structure of the conductors 50 allow them to deflect and deform relative to their contact interfaces 52 and 54. Accordingly, the conductor 50 may deform laterally and vertically in response to movement of the module contacts 4 relative to the PCB contacts 12 responsive to heating and cooling cycles and mechanical vibrations acting upon the assembly 56, reducing stress upon the adhesive connections of the contact interfaces 52 and 54 and the module contacts 4 and PCB contacts 12, respectively, and thereby providing improved resistance to fatigue failures of the contact interfaces. The present invention, therefore, provides for a fixed connection between module and PCB contacts with a superior reliability to that of a prior art solder connection. In another embodiment of the present invention (not shown) two resilient wadded wire conductors 10 are electrically interconnected within one of the apertures 9 with electrically conductive adhesives by applying adhesive to one conductor 10 by automated syringe dispenser, or with a pin transfer process. Stencil deposition may be difficult because of their location within the aperture 9. Noble metal surfaces are preferred for the conductors 10, resulting in a contact resistance that is low and stable through environmental stress.

Another type of conductor (not shown) that may be used with the present invention is the helical formed flexible power connection described in IBM Technical Bulletin No. 94A 61579, Vol. 37, Pub. No. 5, May, 1994, entitled "Flexible Power Connection for Array Applications", the disclosure of which is hereby incorporated.

While preferred embodiments of the invention have been described herein, variations in the design may be made, and such variations may be apparent to those skilled in the art of making tools, as well as to those skilled in other arts. For example, it is readily apparent to one skilled in the art that conductive adhesives may be deposited first directly upon the conductors 10 and 50, rather than upon the contacts 4 and/or 12 first. Similarly, the conductors 10 and 50 may be first aligned and fixedly attached to the PCB contacts 12, and secondly electrically connected by adhesive or compressive means to the module contacts according to the methods provided above. Furthermore, the materials identified above are by no means the only materials suitable for the structure and method of the present invention, and substitute materials will be readily apparent to one skilled in the art. The scope of the invention, therefore, is only to be limited by the following claims.

What is claimed is:

1. A printed circuit board to module mounting and interconnecting structure comprising:

a. a printed circuit board having a top surface, said top surface having a first array of planar electrical contacts, the contacts generally aligned in a common plane;

b. a plurality of deformable resilient electrical conductors having top and bottom ends, a plurality of said bottom ends each electrically engaging one of said printed circuit board contacts in a first electrical connection; and c. a module having a bottom surface, said bottom surface having a second array of planar electrical contacts corresponding to said first array, the contacts generally aligned in a common plane, said module contact alignment plane generally parallel to and opposed to the printed circuit board contact alignment plane, a plurality of said module contacts each electrically engaging one of said electrical conductor top ends in a second electrical connection;

wherein at least one of said first and second electrical connections further comprises an adhesive means for rigidly affixing a first portion of each of said conductors to each of said contacts, said adhesive means engaging a first portion of each of said conductors, wherein said adhesive means is an electrically conductive epoxy adhesive comprising deposits shaped as a portion of a hemisphere on said contacts, said deposits from about 0.020 to about 0.030 inches in horizontal diameter and between about 0.003 inches and about 0.004 inches tall; and wherein a second portion of each of said conductors is not engaged by said adhesive means, said second portion may deform longitudinally and laterally responsive to movement of said printed circuit board relative to said module, and said conductor top and bottom ends maintain said first and second electrical connections as said conductor deforms.

2. The structure of claim wherein the deformable resilient electrical conductors are wadded wire fun button connectors comprising a plurality of noble metal plated wires.

3. The structure of claim 2 wherein the wire noble plating is selected from the group consisting of gold, palladium, silver and palladium nickel alloys.

4. A method for mounting and interconnecting a printed circuit board to a module, comprising the steps of:
   a. providing a printed circuit board substrate having a top surface, said top surface having a first my of planar electrical, contacts, the contacts generally aligned in a common plane;
   b. providing a module substrate having a bottom surface, said bottom surface having a second array of planar electrical contacts corresponding to said first array, the contacts generally aligned in a common plane, said module contact alignment plane generally parallel to and opposed to the printed circuit board contact alignment plane;
   c. depositing a solder deposit on each contact of one of said first and second arrays of contacts;
   d. providing a plurality of deformable resilient wadded wire fin buxton electrical conductors comprising a plurality of noble metal plated wires, the electrical conductors having first and second ends;
   e. plating a second portion of each of the conductors first ends to make the second portion non-solder wettable;
   f. providing an alignment interposer having top and bottom surfaces, said interposer further defining an array of apertures extending through the interposer from the top interposer surface to the bottom interposer surface;
   g. disposing one of the deformable resilient electrical conductors having first and second ends within each of the interposer apertures, one of said conductor first and second ends projecting beyond the interposer top surface, the other of said conductor first and second ends projecting beyond the interposer bottom surface;
   h. aligning the interposer with the contact array having the solder deposits, wherein each one of the conductor first ends is aligned with each one of the contacts having the solder deposits;
   i. engaging a first portion of the conductor first ends with the wider by beating the solder;
   j. flowing the solder onto a first portion of said conductors first ends;
   k. cooling the solder, thereby
   l. curing the wider into rigid connections between the conductor first ends first portions and the engaged array contacts;
   m. aligning each of the conductor second ends with each of the contacts of the other of the first and second arrays;
   n. electrically engaging the conductor second ends with each of the contacts of the other of the first and second rays, and thereby electrically connecting the first array contacts to the second array contacts; and
   o. mechanically connecting the conductor second ends to the contacts of the other array, and thereby forming an assembly of the first and second array contacts and the conductors.

5. The method of claim 4 wherein the wire noble plating is selected from the group consisting of gold, palladium, silver and palladium nickel alloys.

6. A method for mounting and interconnecting a printed circuit board to a modules comprising the steps of:
   a. providing a printed circuit board substrate having a top surface, said top surface having a first array of planar electrical contacts, the contacts generally aligned in a common plane;
   b. providing a module substrate having a bottom surface, said bottom surface having a second array of planar electrical contacts corresponding to said first my, the contacts generally aligned in a common plane, said module contact alignment plane generally parallel to and opposed to the printed circuit board contact alignment plane;
   c. depositing an uncured adhesive means on each contact of one of said first and second arrays of contacts, wherein the uncured adhesive means is a wet thermoplastic electrically conductive adhesive comprising a solvent;
   d. providing an alignment interposer having top and bottom surfaces, said interposer further defining an array of apertures extending through the interposer from the top interposer surface to the bottom interposer surface;
   e. disposing a deformable resilient wadded wire fuzz button electrical conductor comprising a plurality of noble metal plated wires within each of the interposer apertures, the conductor having first and second ends, one of said conductor first and second ends projecting beyond the interposer top surface, the other of said conductor first and second ends projecting beyond the interposer bottom surface;
   f. aligning the interposer with the contact array having the adhesive means deposits, wherein each one of the conductor first ends is aligned with each one of the contacts having the adhesive deposits;

g. engaging a first portion of the conductor first ends with the wet thermoplastic adhesive;

h. driving off the solvent from the thermoplastic adhesive with a bond cycle, and thereby curing the thermoplastic adhesive and bonding the conductor first ends first portions to the engaged array contacts thereby forming a rigid electrical connection between said conductor first portions and said contacts;

i. aligning each of the conductor second ends with each of the contacts of the other of the first and second arrays;

j. electrically engaging the conductor second ends with each of the contacts of the other of the first and second arrays, and thereby electrically connecting the first may contacts to the second ray contacts; and k. mechanically connecting the conductor second ends to the contacts of the other array, and thereby forming an assembly of the first and second array contacts and the conductors.

7. The method of claim 6 wherein the wire noble plating is selected from the group consisting of gold, palladium, silver and palladium nickel alloys.

8. A method for mounting and interconnecting a printed circuit board to a module, comprising the steps of:

a. providing a printed circuit board substrate having a top surface, said top surface having a first array of planar electrical contacts, the contacts generally aligned in a common plane;

b. providing a module substrate having a bottom surface, said bottom surface having a second array of planar electrical contacts corresponding to said first array, the contacts generally aligned in a common plane, said module contact alignment plane generally parallel to and opposed to the printed circuit board contact alignment plane;

c. depositing an uncured adhesive means on each contact of one of said first and second arrays of contacts, wherein the adhesive deposits are solder;

d. providing an alignment interposer having top and bottom surfaces, said interposer further defining an array of apertures extending through the interposer from the top interposer surface to the bottom interposer surface;

e. providing a plurality of deformable resilient electrical conductors having first and second ends;

f. coating the conductors with a liquid solder mask;

g. curing the liquid solder mask, thereby making the conductors non-solder wettable;

h. etching the liquid solder mask at the conductor first and second ends with a photolithographic process to remove the solder mask from said conductor first and second ends;

i. disposing a deformable resilient electrical conductor within each of the interposer apertures, one of said conductor first and second ends projecting beyond the interposer top surface, the other of said conductor first and second ends projecting beyond the interposer bottom surface;

j. aligning the interposer with the contact array having the adhesive means deposits, wherein each one of the conductor first ends is aligned with each one of the contacts having the adhesive deposits;

k. engaging a first portion of the conductor first ends with the adhesive means deposits by heating the adhesive means;

l. flowing the adhesive means onto a first portion of said conductors first ends;

m. cooling the adhesive means, thereby n. curing the adhesive means into rigid connections between the conductor first ends first portions and the engaged array contacts;

o. aligning each of the conductor second ends with each of the contacts of the other of the first and second arrays;

p. electrically engaging the conductor second ends with each of the contacts of the other of the first and second arrays, and thereby electrically connecting the first array contacts to the second array contacts; and q. mechanically connecting the conductor second ends to the contacts of the other any, and thereby forming an assembly of the first and second array contacts and the conductors.

9. The method of claim 8 wherein the deformable resilient electrical conductors are wadded wire fuzz button connectors comprising a plurality of noble metal plated wires.

10. The method of claim 8 wherein the wire noble plating is selected from the group consisting of gold, palladium, silver and palladium nickel alloys.

* * * * *